(12) United States Patent
Otsuka et al.

(10) Patent No.: US 8,398,774 B2
(45) Date of Patent: Mar. 19, 2013

(54) METHOD OF MANUFACTURING ORGANIC LIGHT EMITTING DEVICE AND VAPOR DEPOSITION SYSTEM

(75) Inventors: Manabu Otsuka, Tokyo (JP); Yuzo Tokunaga, Yokohama (JP); Seiji Mashimo, Yokohama (JP); Toshiaki Yoshikawa, Yokohama (JP); Naoto Fukuda, Funabashi (JP)

(73) Assignee: Canon Kabushiki Kaisha, Tokyo (JP)

( * ) Notice: Subject to any disclaimer, the term of this patent is extended or adjusted under 35 U.S.C. 154(b) by 1073 days.

(21) Appl. No.: 11/610,022

(22) Filed: Dec. 13, 2006

(65) Prior Publication Data

US 2007/0134405 A1    Jun. 14, 2007

(30) Foreign Application Priority Data

Dec. 14, 2005    (JP) .................................. 2005-360025
Dec. 1, 2006    (JP) .................................. 2006-325113

(51) Int. Cl.
   *C23C 16/00*    (2006.01)
(52) U.S. Cl. ......................................... 118/726; 118/715
(58) Field of Classification Search .................... 118/726
   See application file for complete search history.

(56) References Cited

U.S. PATENT DOCUMENTS

| | | | |
|---|---|---|---|
| 3,811,940 A * | 5/1974 | Douglas et al. ................ | 427/595 |
| 3,984,585 A * | 10/1976 | Onozaki et al. ................ | 430/128 |
| 4,526,132 A * | 7/1985 | Ohta ................ | 118/719 |
| 4,878,989 A * | 11/1989 | Purdes ................ | 117/103 |
| 5,239,611 A | 8/1993 | Weinert | |
| 5,558,718 A * | 9/1996 | Leung ................ | 118/723 E |
| 6,367,414 B2 * | 4/2002 | Witzman et al. ........ | 118/723 VE |
| 6,396,209 B1 | 5/2002 | Kido et al. ................ | 313/504 |
| 6,749,906 B2 * | 6/2004 | Van Slyke ................ | 427/591 |
| 2004/0232832 A1 * | 11/2004 | Kubota ................ | 313/512 |
| 2004/0239239 A1 | 12/2004 | Fukase ................ | 313/506 |
| 2005/0005857 A1 * | 1/2005 | Kido et al. ................ | 118/726 |
| 2005/0084713 A1 | 4/2005 | Kido et al. ................ | 428/690 |
| 2006/0110867 A1 * | 5/2006 | Yabuta et al. ................ | 438/151 |
| 2006/0276055 A1 * | 12/2006 | Numasawa et al. ........... | 438/795 |
| 2006/0283382 A1 | 12/2006 | Yoshikawa et al. ........... | 117/200 |

FOREIGN PATENT DOCUMENTS

| | | |
|---|---|---|
| JP | 5-59538 A | 3/1993 |
| JP | 5-139882 A | 6/1993 |
| JP | 6-10118 A | 1/1994 |
| JP | 7-70741 A | 3/1995 |

(Continued)

OTHER PUBLICATIONS

English-language translation of the Office Action dated Jul. 26, 2011, issued in Japanese Patent Application No. 2006-325113.

(Continued)

*Primary Examiner* — Keath Chen
(74) *Attorney, Agent, or Firm* — Fitzpatrick, Cella, Harper & Scinto

(57) ABSTRACT

Provided is a method of manufacturing an organic light emitting device including the step of forming an electron injection layer. The step of forming the electron injection layer includes the steps of: vaporizing in a container a dopant material as a raw material of a dopant; causing the vaporized dopant material to pass a heated medium between the container and the substrate; and forming the organic compound into the electron injection layer. According to the method the organic light emitting device which has high electron injection efficiency and can be driven at a low voltage can be obtained.

2 Claims, 4 Drawing Sheets

FOREIGN PATENT DOCUMENTS

| | | |
|---|---|---|
| JP | 7-258828 A | 10/1995 |
| JP | 09-061603 A | 3/1997 |
| JP | 11-172421 A | 6/1999 |
| JP | 11-315370 A | 11/1999 |
| JP | 2000-182774 | 6/2000 |
| JP | 2001-192816 A | 7/2001 |
| JP | 2003-031363 A | 1/2003 |
| JP | 2003-247062 A | 9/2003 |
| JP | 2003-301255 A | 10/2003 |
| JP | 2004-311403 | 11/2004 |
| JP | 2005-123094 | 5/2005 |
| JP | 2006-59640 A | 3/2006 |

OTHER PUBLICATIONS

Office Action in Japanese Application No. 2006-325113 (Jan. 31, 2012) (4 pages).

Office Action in Japanese Application No. 2006-325113, issued Nov. 20, 2012, with English translation (10 pages).

* cited by examiner

METHOD OF MANUFACTURING ORGANIC LIGHT EMITTING DEVICE AND VAPOR DEPOSITION SYSTEM

BACKGROUND OF THE INVENTION

1. Field of the Invention

The present invention relates to a method of manufacturing an organic light emitting device and vapor deposition system.

2. Description of the Related Art

An organic light emitting device is generally formed of a laminated structure including a substrate, an anode, a hole transport layer, a light emitting layer, an electron transport layer, an electron injection layer, and a cathode. In order to make lower the voltage of such an organic light emitting device, it is important to improve electron injectability from the cathode. More specifically, in order to improve electron injection efficiency, a metal, a metal compound, a metal salt, or the like having a low work function is used as a dopant. An organic layer containing such a dopant is used as the electron injection layer, and the dopant functions as a donor (electron donative) dopant.

In an organic film of the electron injection layer, a metal having a low work function donates electrons to put organic molecules in a radical anion state. This makes it possible for adjoining molecules to donate or accept electrons smoothly, and an injection barrier from the cathode is lowered to improve the electron injectability. Further, electron transportability by a hopping mechanism in the organic layer can also be improved.

Japanese Patent Application Laid-Open Nos. 2000-182774, 2004-311403, and 2005-123094 disclose lowering of an electron injection barrier by forming an electron injection layer so as to contain a metal compound and reducing the metal compound in the electron injection layer.

However, according to the technology disclosed in Japanese Patent Application Laid-Open Nos. 2000-182774, 2004-311403, and 2005-123094, when the metal compound is not reduced and remains in an organic film, it does not sufficiently function as a donor dopant, and even if a doping concentration is improved, drive voltage is not lowered. On the contrary, there is a possibility that the drive voltage may rise.

SUMMARY OF THE INVENTION

In view of the above, an object of the present invention is to provide a method of manufacturing an organic light emitting device which has high electron injection efficiency and can be driven at a low voltage, and to provide a vapor deposition system.

That is, according to an aspect of the present invention, there is provided a method of manufacturing an organic light emitting device, the organic light emitting device including: a substrate; an anode and a cathode provided on the substrate; a light emitting layer provided between the anode and the cathode; and an electron injection layer provided on a side of the cathode with respect to the light emitting layer, the electron injection layer including an organic compound and a dopant, the method including the step of forming the electron injection layer in which the step of forming the electron injection layer includes the steps of: vaporizing in a container a dopant material as a raw material of the dopant; causing the vaporized dopant material to pass a heated medium between the container and the substrate; and forming the organic compound into the electron injection layer.

Further, according to another aspect of the present invention, there is provided a vapor deposition system including: a container for containing a vapor deposition material therein; heating means for vaporizing the vapor deposition material contained in the container; a medium provided in a position between the container and a base material to be vapor-deposited where the vaporized vapor deposition material passes; and a shielding member provided between the medium and the base material to be vapor-deposited, for shielding heat generated by the medium.

According to the present invention, the electron-injecting dopant in the electron injection layer can be caused to function more efficiently. As a result, the organic light emitting device manufactured according to the present invention has high electron injection efficiency and can be driven at a low voltage. Further, according to the present invention, continuous production over a long period of time without deteriorating device characteristics can be carried out.

Further features of the present invention will become apparent from the following description of exemplary embodiments with reference to the attached drawings.

DESCRIPTION OF THE EMBODIMENTS

Embodiments of the present invention are now described in detail in the following.

Figure 1:
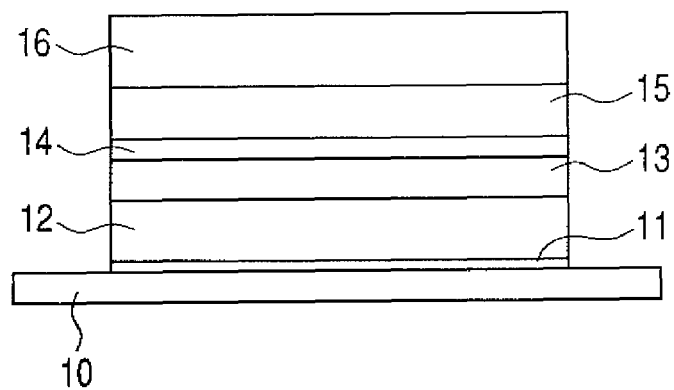
FIG. 1 is a schematic view of an exemplary laminated structure of an organic light emitting device manufactured according to the present invention.

The present invention relates to a method of manufacturing an organic light emitting device having an organic layer as an electron injection layer, which contains a dopant material (electron-injecting dopant material) which functions as a donor (electron donative) dopant for improving electron injection efficiency as, for example, illustrated in FIG. 1. The manufacturing method according to the present invention is a method of manufacturing an organic light emitting device having a substrate, an anode and a cathode provided on the substrate, a light emitting layer provided between the anode and the cathode, and an electron injection layer provided on a side of the cathode with respect to the light emitting layer, the electron injection layer including an organic compound and a dopant. In FIG. 1, reference numerals 10, 11, 12, 13, 14, 15, and 16 designate the substrate, the anode, a hole transport layer, the light emitting layer, an electron transport layer, the electron injection layer, and the cathode, respectively. The electron transport layer 14 is preferably formed only of an organic compound.

In the manufacturing method according to the present invention, the step of forming the electron injection layer includes the step of vaporizing in a container the dopant material which is a raw material of the dopant, the step of causing the vaporized dopant material to pass a heated medium between the container and the substrate, and the step of forming an organic compound into the electron injection layer.

More specifically, when the electron injection layer 15 is formed, a substance directly heated by energization or a substance indirectly heated by a heat source is used as the medium. Alternatively, a substance heated by induction heating may be used as the medium. Induction heating make unnecessary wiring for feeding and terminal section which come to be a high temperature, enables to suppress thermal effect to the substrate and the circumference, and enables to design the vapor depositing source compactly. The inventors considers that by causing the vaporized dopant material to pass the heated medium between the container and the substrate, decomposition of the dopant material is accelerated and more active state where electrons are likely to be given is obtained.

As a result, an organic light emitting device which can be driven at a low voltage can be manufactured. It is to be noted that the vaporized state refers not only to a state where the dopant material itself is vaporized but also to a state where a product of the decomposition of the dopant material is vaporized. Although, in the following, the present invention is specifically described in the context of forming the electron injection layer 15 by vapor deposition, the present invention is not limited thereto.

Figure 2:
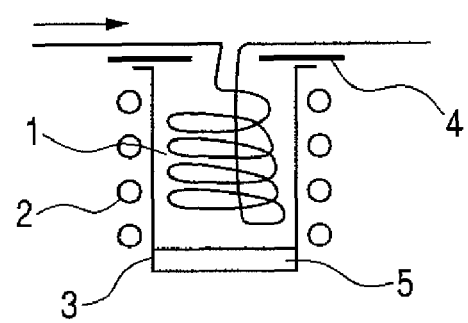
FIG. 2 is a schematic view of an exemplary vapor depositing source used in the present invention.

FIG. 2 illustrates an exemplary vapor depositing source used in the present invention. In FIG. 2, a medium 1 is a coiled tungsten filament heated by energization. A heat source 2 heats a container (crucible) 3. Reference numerals 4 and 5 denote a shielding member (upper lid) and an electron-injecting dopant material, respectively. It is to be noted that in FIGS. 3, 4, 5, 6, and 7, like reference numerals designate like members illustrated in FIG. 2.

For the electron-injecting dopant material 5, for example, alkali metal compounds, alkaline earth metal compounds, or the like can be used. In order to improve electron injection efficiency, it is preferable that a metal having a low work function or a compound thereof is used as the dopant. Exemplary metals having a low work function include alkali metals. However, alkali metals react vigorously with moisture in the air and thus, it is difficult to handle them in the atmosphere. It follows that, in the present invention, it is preferable to use an alkali metal compound or an alkaline earth metal compound which are relatively easily handled in the atmosphere, and more preferably an alkali metal compound. Exemplary alkali metal compounds include $Na_2O$, $K_2O$, $Rb_2O$, $Cs_2O$, $Na_2CO_3$, $K_2CO_3$, $Rb_2CO_3$, and $Cs_2CO_3$, and exemplary alkaline earth metal compounds include MgO, CaO, SrO, $MgCO_3$, $CaCO_3$, and $SrCO_3$. Among them, cesium carbonate is more preferable, because cesium carbonate is stable in the atmosphere and is easily handled, and the atomic radius of cesium is large and therefore diffusion into an adjoining layer is less liable to occur.

While an alkali metal alone may be used as the electron injection layer, an alkali metal compound and an alkaline earth metal compound have, differently from a metal, low conductivity. Therefore, the electron injection layer manufactured according to the present invention is a layer where an electron-injecting dopant material is doped in an organic compound which transports electrons. For the organic compound which transports electrons, a well-known material such as an alumiquinolinol complex and a phenanthroline compound may be used.

Although the substance used as the medium 1 is not particularly limited, a metal which decomposes the electron-injecting dopant material by chemical reaction with the electron-injecting dopant material is preferable, because, in addition to decomposition due to heat, decomposition due to chemical reaction such as reduction reaction can also be expected.

Figure 3:
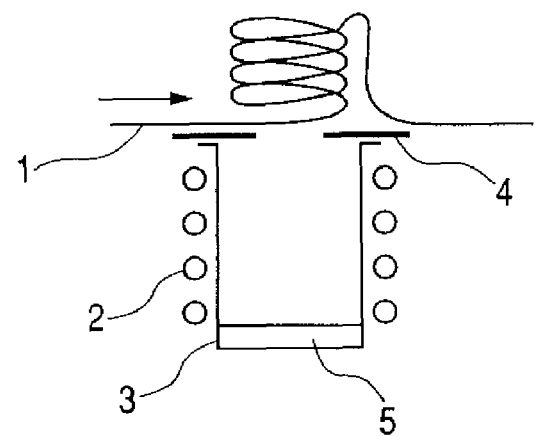
FIG. 3 is a schematic view of another exemplary vapor depositing source used in the present invention.

The medium 1 is preferably provided at a location where it is in contact with the vaporized electron-injecting dopant material 5. By bringing the vaporized electron-injecting dopant material 5 into contact with the medium 1, secondary decomposition of the electron-injecting dopant material 5 can be accelerated. Further, the location where the medium 1 is provided is not necessarily limited to the inside of the container 3, and, as illustrated in FIG. 3, the medium 1 may be provided immediately above the container 3.

Further, it is preferable that the medium 1 is apart from the electron-injecting dopant material 5. In other words, it is preferable that the medium 1 is provided so as not to be in contact with the electron-injecting dopant material 5. For example, when the medium 1 is made of a metal which causes decomposition of the electron-injecting dopant material by chemical reaction with the electron-injecting dopant material, direct contact of the medium 1 with the electron-injecting dopant material 5 changes the contact area, which may result in variations. Further, if the surface of the medium is covered with a by-product or a residue formed by direct reaction, the medium may be deteriorated or the effect may be lowered. If the medium 1 is provided at a location where it is not in contact with the solid electron-injecting dopant material 5 but is in contact with the vaporized electron-injecting dopant material 5, the surface of the medium is less liable to be covered with a residue or a by-product of the reaction, so even after vapor deposition over a long period of time, decomposition by the chemical reaction is expected, and the characteristics of the device can be maintained.

Figure 7:
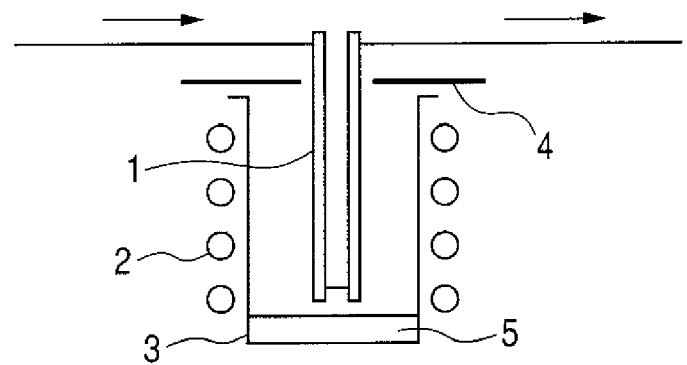
FIG. 7 is a schematic view of yet another exemplary vapor depositing source used in the present invention.

The shape of the medium 1 is not limited to the coiled filament, and is preferably formed in a shape in accordance with the vapor depositing source. For example, the shape may be spherical (FIG. 4), plate-like (FIG. 5), mesh-like (FIG. 6), or rod-like (FIG. 7). Further, because the medium 1 can accelerate the decomposition more efficiently by increasing the contact area thereof, it is also preferable that a plurality of the medium 1 are provided as illustrated in, for example, FIGS. 4 and 5.

From the viewpoint of preventing precipitation of the electron-injecting dopant material 5, the temperature of the medium 1 is preferably equal to or higher than the vaporizing temperature of the electron-injecting dopant material 5 under vacuum, and more preferably 200° C. or higher. Further, although it is preferable that the temperature of the medium 1 is high from the viewpoint of accelerating the decomposition, taking into consideration the adverse effect of radiant heat on the organic light emitting device and on a region around the vapor depositing source, the temperature is preferably 2000° C. or lower. More preferably, the temperature is in the neighborhood of 1000° C., where the effect of the present invention is adequate and, at the same time, the adverse effect of radiant heat can be suppressed relatively easily.

Figure 8:
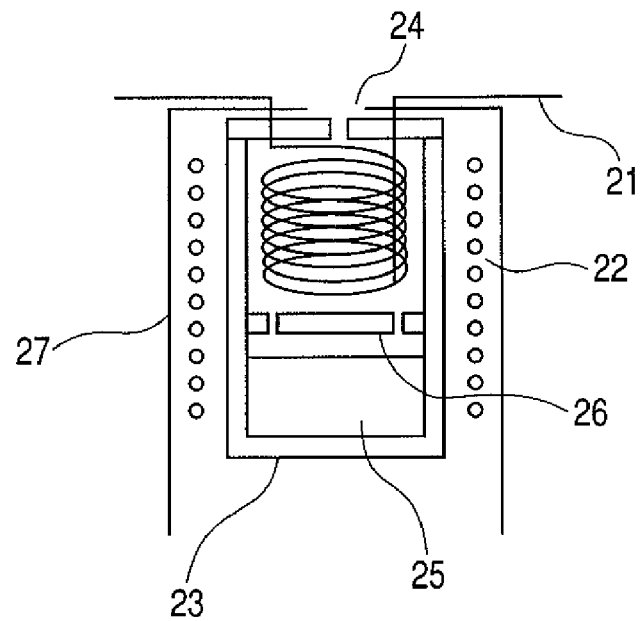
FIG. 8 is a schematic view of still another exemplary vapor depositing source used in the present invention.
Figure 10:
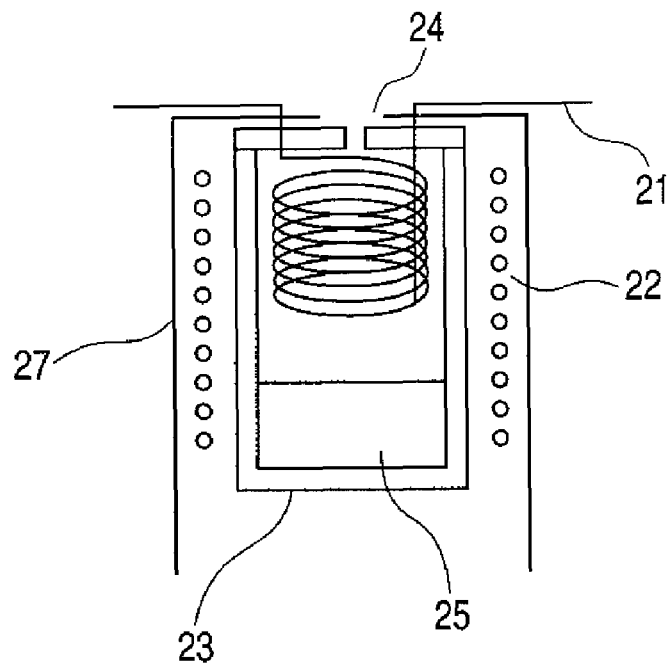
FIG. 10 is a schematic view of still another exemplary vapor depositing source used in the present invention.
Figure 11:
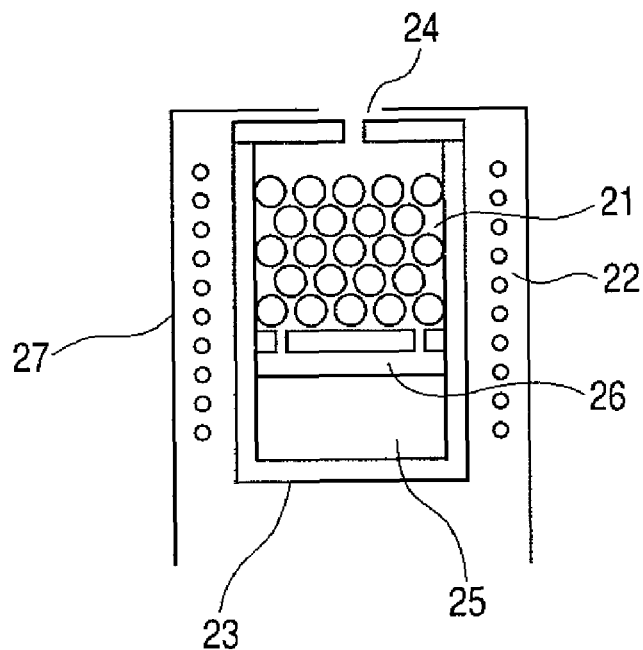
FIG. 11 is a schematic view of yet another exemplary vapor depositing source used in the present invention.

Further, the present invention provides a vapor deposition system having a container for containing a vapor deposition material therein, heating means for vaporizing the vapor deposition material contained in the container, a medium provided between the container and a base material to be vapor-deposited where the vaporized vapor deposition material passes, and a shielding member provided between the medium and the base material to be vapor-deposited, for shielding heat generated by the medium. FIGS. 8, 10, and 11 are schematic views each illustrating an exemplary vapor deposition system according to the present invention. In FIGS. 8, 10, and 11, reference numerals 21, 22, 23, 24, 25, 26, and 27 denote a medium, a heat source, a container, a shielding member (upper lid), a dopant material, another shielding member, and a reflector, respectively.

Because provision of the shielding member 24 prevents the base material to be formed in film from being directly exposed to radiant heat from the medium 21, the adverse effect of heat on the base material to be formed in film and on the region around the vapor depositing source can be further suppressed. Therefore, when the organic light emitting device is manufactured, deterioration of performance of the device due to adverse effect on the organic compound forming the device and the like can be suppressed.

The shielding member 24 is provided at an opening of the container 23. The medium 21 is preferably provided in a space defined by the shielding member 24 and the container 23. By providing and confining the medium 21 in the space, the vaporized dopant material 25 can be positively brought into contact with the medium 21. In this case, the shielding member 24 functions as a lid of the container 23. It is to be noted that the shielding member 24 has the opening such that the vaporized dopant material 25 moves toward the base material to be vapor-deposited.

Further, as illustrated in FIGS. 8 and 11, it is preferable that another shielding member (middle lid) 26 is provided between the dopant material 25 and the medium 21. Provision of the shielding member 26 more positively brings the vaporized dopant material 25 into contact with the medium 21. As a result, the light emitting performance of the organic light emitting device can be further improved.

Further, when there is no shielding member 24 or another shielding member, the dopant material 25 is likely to be formed as a film as a clod (hereinafter "cluster"). The cluster leads to generate non-luminous points, resulting that there is a possibility that deterioration of device properties and defects of device occur. However, provision of the shielding member 24 or another shielding member 26 enables to suppress generation of cluster.

Although examples of the present invention are described in the following, the present invention is not limited thereto.

Example 1

A device illustrated in FIG. 1 was manufactured. In this example, chromium (Cr) which functions as a reflecting electrode was used as the anode 11 and indium tin oxide (ITO) which functions as a transparent electrode for taking out emitted light was used as the cathode 16 to manufacture a top emission type device.

A chromium (Cr) film was formed on the substrate 10 by sputtering in a thickness of 200 nm to obtain the anode 11. After that, the substrate was cleaned with UV/ozone.

Then, the cleaned substrate and the material were loaded on a vacuum vapor deposition system (manufactured by ULVAC KIKO, Inc.). After exhausting air such that the pressure inside becomes $1 \times 10^{-6}$ Torr, an N, N'-α-dinaphthylbenzidine (α-NPD) film was formed on the anode 11 in a thickness of 60 nm to form the hole transport layer 12. Further, a co-deposited film of coumarin 6 (1.0 wt %) and tris(8-hydroxyquinolinato) aluminum ($Alq_3$) was formed thereon in a thickness of 30 nm to form the light emitting layer 13. Then, as the electron transport layer 14, a phenanthroline compound film was formed in a thickness of 10 nm.

Then, a film formed of a phenanthroline compound and cesium carbonate as the electron-injecting dopant material was formed on the electron transport layer 14 in a thickness of 40 nm to constitute the electron injection layer 15. As the vapor depositing source of cesium carbonate, the one illustrated in FIG. 2 was used. More specifically, an alumina crucible was used as the container 3, a tungsten filament as the medium 1 was provided in the container 3 which is in contact with the vaporized cesium carbonate most, and vapor deposition was carried out with the tungsten filament being heated by energization. A covered thermocouple was welded to several arbitrarily chosen points on the tungsten filament to measure the temperature. The lowest temperature was about 700° C. while the highest temperature was about 1000° C.

It is to be noted that a single film was separately formed on a silicon wafer under the same conditions as those for the electron injection layer 15 and the concentration of cesium ions was determined by ICP-MS analysis. It was confirmed that the concentration of cesium in the electron injection layer 15 was about 2 wt %.

Finally, an indium tin oxide (ITO) film was formed on the electron injection layer 15 by sputtering in a thickness of 150 nm to obtain the transparent cathode 16 for taking out emitted light. After that, the substrate was moved into a glove box, and the device was encapsulated using a glass cap having a desiccant provided therein in an atmosphere of nitrogen.

Direct current voltage was applied to the obtained organic light emitting device with the voltage varied from 0 V in increments of 0.1 V, and light emitting characteristics were examined. As a result, the current density of the device when the applied voltage was 5.0 V was calculated to be 80.5 $mA/cm^2$ and the light emitting efficiency when the applied voltage was 5.0 V was calculated to be 4.2 cd/A.

Further, after vapor deposition of cesium carbonate of the electron injection layer 15 was continuously carried out, the organic light emitting device was manufactured by the same manufacturing procedure. The current density of the device when the applied voltage was 5.0 V was calculated to be 80.0 $mA/cm^2$ and the light emitting efficiency when the applied voltage was 5.0 V was calculated to be 4.3 cd/A. It was confirmed that there was almost no change.

Comparative Example 1

A device was manufactured by a method similar to that of Example 1 except that vapor deposition of cesium carbonate was carried out without using a tungsten filament, and evaluation was made. The result is shown in Table 1.

Comparative Example 2

A device was manufactured by a method similar to that of Comparative Example 1 except that vapor deposition was carried out such that the concentration of cesium in the electron injection layer 15 was about 4 wt %, and evaluation was made. The result is shown in Table 1.

As shown in Table 1, even though the doping concentration was higher than that in Example 1, the characteristics of the device were inferior to those of the device in Example 1.

Example 2

As a vapor depositing source of cesium carbonate, one illustrated in FIG. 3 was used. More specifically, a tungsten filament as the medium 1 was provided above the alumina crucible 3, and vapor deposition was carried out with the tungsten filament heated by energization.

A device was manufactured by a method similar to that of Example 1 except for the above, and evaluation was made. The result is shown in Table 1.

Example 3

Figure 4:
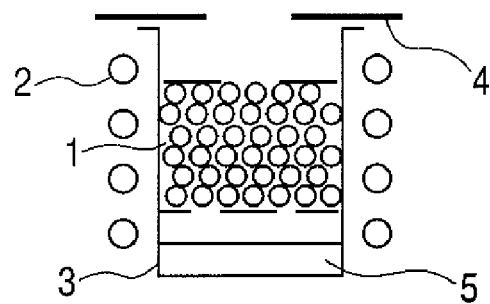
FIG. 4 is a schematic view of still another exemplary vapor depositing source used in the present invention.
Figure 5:
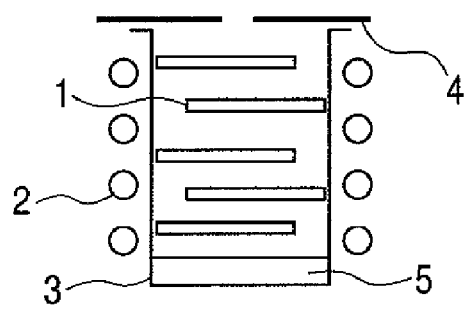
FIG. 5 is a schematic view of yet another exemplary vapor depositing source used in the present invention.
Figure 6:
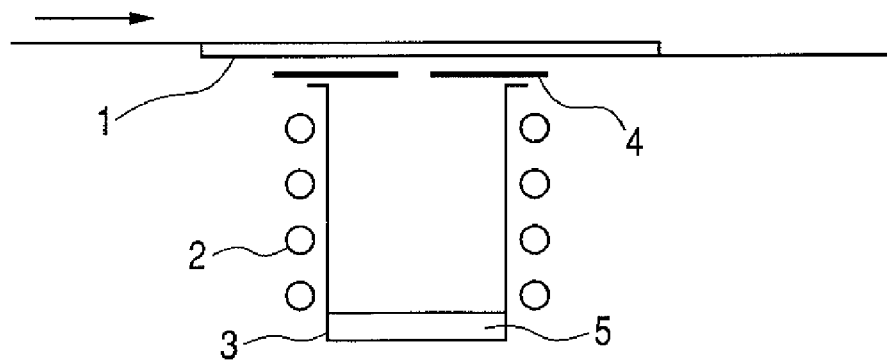
FIG. 6 is a schematic view of still another exemplary vapor depositing source used in the present invention.

As a vapor depositing source of cesium carbonate, one illustrated in FIG. 4 was used. More specifically, spherical tungsten as the medium 1 was provided in the alumina crucible 3, and vapor deposition was carried out with the spherical tungsten indirectly heated by heat from the heat source 2. A thermocouple was attached to a bottom surface of the crucible 3 to measure the temperature, and the temperature was about 700° C.

A device was manufactured by a method similar to that of Example 1 except for the above, and evaluation was made. The result is shown in Table 1.

Example 4

A device was manufactured by a method similar to that of Example 1 except that vapor deposition of cesium carbonate was carried out with less electric current for energizing the tungsten filament, and evaluation was made. The result is shown in Table 1.

It is to be noted that, similarly to the case of Example 1, the temperature was measured at arbitrarily chosen points on the tungsten filament. The lowest temperature was about 500° C. at a point near the top of the crucible 3 while the highest temperature was about 700° C. at a point near the center of the filament.

Example 5

A device was manufactured by a method similar to that of Example 2 except that vapor deposition of cesium carbonate was carried out with less electric current for energizing the tungsten filament, and evaluation was made. The result is shown in Table 1.

It is to be noted that, similarly to the case of Example 1, the temperature was measured at arbitrarily chosen points on the tungsten filament. The lowest temperature was about 200° C. at a point near the top of the crucible 3 while the highest temperature was about 500° C. at a point near the center of the filament.

After vapor deposition of cesium carbonate was continuously carried out, the color of the tungsten filament was slightly changed to brown. However, as shown in Table 1, although deterioration proceeded more than that in Example 1, it was confirmed that the effect was maintained.

Comparative Example 3

A device was manufactured by a method similar to that of Example 2 except that vapor deposition of cesium carbonate was carried out without energizing the tungsten filament, and evaluation was made. The result is shown in Table 1.

TABLE 1

| | Heater Material Location for Provision | Heater Temperature | Result of Cesium Detection | Characteristics where 5.0 V was applied | Characteristics after Continuous Production |
|---|---|---|---|---|---|
| Example 1 | Tungsten Filament in Crucible | 700–1000° C. | 2 wt % | 80.5 mA/cm$^2$ 4.2 cd/A | 80.0 mA/cm$^2$ 4.3 cd/A |
| Comparative Example 1 | No Heater Material | Crucible Temperature 600–700° C. | 2 wt % | 43.2 mA/cm$^2$ 4.0 cd/A | — |
| Comparative Example 2 | No Heater Material | Crucible Temperature 600–700° C. | 4 wt % | 60.8 mA/cm$^2$ 4.1 cd/A | — |
| Example 2 | Tungsten Filament above Crucible | 800–1100° C. | 2 wt % | 79.6 mA/cm$^2$ 4.3 cd/A | 80.3 mA/cm$^2$ 4.2 cd/A |
| Example 3 | Spherical Tungsten in Crucible | 700° C. | 2 wt % | 62.3 mA/cm$^2$ 4.4 cd/A | 55.4 mA/cm$^2$ 4.6 cd/A |
| Example 4 | Tungsten Filament in Crucible | 500–700° C. | 2 wt % | 68.9 mA/cm$^2$ 4.5 cd/A | 65.3 mA/cm$^2$ 4.4 cd/A |
| Example 5 | Tungsten Filament above Crucible | 200–500° C. | 2 wt % | 55.8 mA/cm$^2$ 4.4 cd/A | 50.3 mA/cm$^2$ 4.0 cd/A |
| Comparative Example 3 | Tungsten Filament above Crucible | No Energization | 2 wt % | 43.8 mA/cm$^2$ 4.1 cd/A | — |

It is to be noted that, after vapor deposition of cesium carbonate was continuously carried out, the color of the spherical tungsten was changed to black, and the surface was covered with a residue. However, as shown in Table 1, although the initial value could not be maintained, it was confirmed that the characteristics could be continuously maintained.

From the results shown above, it is assumed that, at least by heating, the dopant can be made to function more efficiently. Further, even at a temperature equal to or higher than 1000° C., effects comparable to or greater than those of Example 1 can be expected.

Example 6

A device illustrated in FIG. 1 was manufactured. In the present example, chromium (Cr) which functions as a reflecting electrode was used as the anode 11 and indium tin oxide (ITO) which functions as a transparent electrode for taking out emitted light was used as the cathode 16 to manufacture a top emission type device.

A chromium (Cr) film was formed on the substrate 10 by sputtering in a thickness of 200 nm to obtain the anode 11. After that, the substrate was cleaned with UV/ozone.

Then, the cleaned substrate and the material were loaded on a vacuum vapor deposition system (manufactured by ULVAC KIKO, Inc.). After exhausting air such that the pressure inside becomes 1×10$^{-6}$ Torr, an N, N'-α-dinaphthylbenzidine (α-NPD) film was formed on the anode 11 in a thickness of 60 nm to form the hole transport layer 12. Further, a co-deposited film of coumarin 6 (1.0 wt %) and tris(8-hydroxyquinolinato) aluminum (Alq$_3$) was formed thereon in a thickness of 30 nm to form the light emitting layer 13. Then, as the electron transport layer 14, a phenanthroline compound film was formed in a thickness of 10 nm.

Then, a film formed of a phenanthroline compound and cesium carbonate as the electron-injecting dopant material was formed on the electron transport layer 14 in a thickness of 40 nm to constitute the electron injection layer 15. As the vapor depositing source of cesium carbonate, the one illustrated in FIG. 8 was used. More specifically, alumina was used for the container 23, the shielding member (upper lid) 24, and the other shielding member (middle lid) 26, and the medium 21 was provided between the upper lid 24 and the middle lid 26 in the container 23.

The middle lid 26 preferably has a plurality of openings formed therein, and the locations of the openings are preferably vertically offset from the opening in the upper lid 24. Further, it is preferable that the conductance of the openings in the middle lid 26 is larger than that of the opening in the upper lid 24. The diameter φ of the opening in the upper lid 24 used here was 2 mm. The diameter φ of the openings in the middle lid 26 was 1 mm and there were six openings in the middle lid 26 around the periphery.

The numbers and diameters of the openings in the upper lid 24 and the middle lid 26 are not limited thereto.

This structure allows positive contact of the medium 21 provided between the upper lid 24 and the middle lid 26 with the vaporized cesium carbonate to improve the device characteristics. Further, because cesium carbonate undergoes vapor deposition through the middle lid 26 and the upper lid 24, the number of clusters is decreased and device defects are decreased.

The vapor depositing source was used to carry out vapor deposition of cesium carbonate with the tungsten filament heated by energization.

A covered thermocouple was welded to several arbitrarily chosen points on the tungsten filament to measure the temperature. The lowest temperature was about 700° C. while the highest temperature was about 1000° C.

It is to be noted that a single film was separately formed on a silicon wafer under the same conditions as those for the electron injection layer 15 and the concentration of cesium ions was determined by ICP-MS analysis. It was confirmed that the concentration of cesium in the electron injection layer 15 was about 2 wt %. The concentration distribution of cesium within a diameter of 75 mm of a film formed 250 mm above the vapor depositing source was ±2.3%.

The substrate temperature 250 mm above the vapor depositing source was 43° C.

With regard to the number of clusters of $Cs_2CO_3$, a single film was separately formed on a cleaned silicon wafer under the same conditions as those for the electron injection layer 15 and an aluminum film was formed in a thickness of 300 nm so as to cover the film. Ten such samples were manufactured, and the surface where the film was formed was observed with a microscope under dark field illumination, and the number of bright spots within a diameter of 10 mm was counted. When the vapor depositing source for $Cs_2CO_3$ in the present example was used, no bright spots were recognized.

Finally, an indium tin oxide (ITO) film was formed on the electron injection layer 15 by sputtering in a thickness of 150 nm to obtain the transparent cathode 16 for taking out emitted light. After that, the substrate was moved into a glove box, and the device was encapsulated using a glass cap having a desiccant provided therein in an atmosphere of nitrogen.

Direct current voltage was applied to the obtained organic light emitting device with the voltage varied from 0 V in increments of 0.1 V, and light emitting characteristics were examined. As a result, the current density of the device when the applied voltage was 5.0 V was calculated to be 83.0 mA/cm² and the light emitting efficiency when the applied voltage was 5.0 V was calculated to be 4.7 cd/A.

Further, after vapor deposition of cesium carbonate of the electron injection layer 15 was continuously carried out, the organic light emitting device was manufactured by the same manufacturing procedure. The current density of the device when the applied voltage was 5.0 V was calculated to be 82.8 mA/cm² and the light emitting efficiency when the applied voltage was 5.0 V was calculated to be 4.7 cd/A. It was confirmed that there was almost no change.

Example 7

Figure 9:
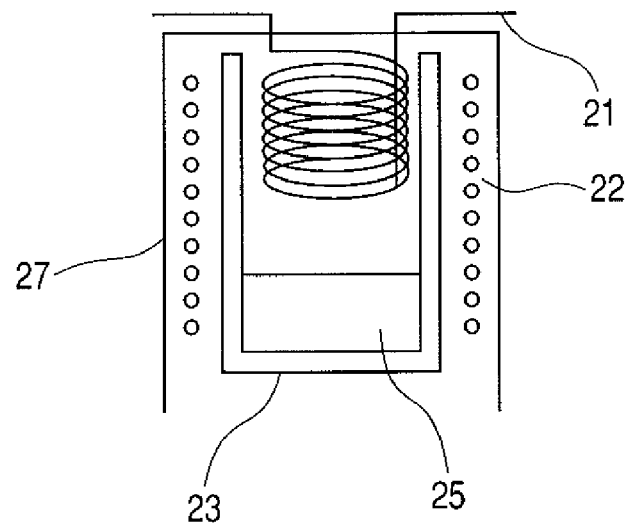
FIG. 9 is a schematic view of yet another exemplary vapor depositing source used in the present invention.

A device was manufactured using a vapor depositing source structure similar to that of Example 6 but without the middle lid and the upper lid (FIG. 9) under the same conditions as those for Example 6, and characteristics were evaluated. In FIG. 9, like reference numerals designate like members illustrated in FIG. 8. The result is shown in Table 2. It is assumed that, because there was no middle lid and no upper lid, the tungsten filament and cesium carbonate were not sufficiently in contact with each other, and thus, even though the amount of cesium in the film was the same, the amount of cesium effective for the device characteristics was small, and thus, the characteristics were inferior to those of Example 6.

Further, the concentration distribution of cesium within a diameter of 75 mm of a film formed 250 mm above the vapor depositing source was ±10.6%.

When the vapor depositing source was used, because the substrate was directly exposed to radiant heat generated by the tungsten filament, the substrate temperature 250 mm above the vapor depositing source was 108° C.

Further, the number of clusters of $Cs_2CO_3$ counted in the same way as in Example 6 was 518 on average of the ten samples.

Example 8

As the vapor depositing source of cesium carbonate, one illustrated in FIG. 10 was used.

A device was manufactured using a vapor depositing source similar to that of Example 6, but without the middle lid under the same conditions as those for Example 6, and evaluation was made. The result is shown in Table 2.

The concentration distribution of cesium within a diameter of 75 mm of a film formed 250 mm above the vapor depositing source and the substrate temperature 250 mm above the vapor depositing source were substantially equal to those of Example 6.

The number of clusters of $Cs_2CO_3$ counted was 1.6 on average of the ten samples.

Example 9

As the vapor depositing source of cesium carbonate, one illustrated in FIG. 11 was used. More specifically, spherical tungsten as the medium 21 was provided in the alumina crucible 23 between the middle lid 26 and the upper lid 24, and vapor deposition was carried out with the spherical tungsten indirectly heated by heat from the heat source 22. A device was manufactured by a method similar to that of Example 6 except for the above, and evaluation was made. The result is shown in Table 2.

Example 10

A device was manufactured by a method similar to that of Example 6 except that vapor deposition was carried out such that the concentration of cesium in the electron injection layer 15 was about 1 wt %, and evaluation was made. The result is shown in Table 2.

TABLE 2

|  | Characteristics where 5.0 V was Applied | Characteristics after Continuous Production | Concentration Distribution of $Cs_2CO_3$ ($\phi$75 mm) | Substrate temperature 250 mm above Vapor Depositing Source | Number of Clusters ($\phi$10 mm, Average of Ten Samples) |
|---|---|---|---|---|---|
| Example 6 | 83.0 mA/cm$^2$ 4.7 cd/A | 82.8 mA/cm$^2$ 4.7 cd/A | ±2.3% | 43° C. | 0 |
| Example 7 | 76.2 mA/cm$^2$ 4.1 cd/A | 75.2 mA/cm$^2$ 4.1 cd/A | ±10.6% | 108° C. | 518 |
| Example 8 | 80.5 mA/cm$^2$ 4.2 cd/A | 80.0 mA/cm$^2$ 4.3 cd/A | ±2.5% | 44° C. | 1.6 |
| Example 9 | 62.3 mA/cm$^2$ 4.4 cd/A | 55.4 mA/cm$^2$ 4.6 cd/A | ±2.5% | 48° C. | 0 |
| Example 10 | 81.2 mA/cm$^2$ 4.4 cd/A | 80.8 mA/cm$^2$ 4.4 cd/A | ±2.4% | 41° C. | 0 |

By using the vapor depositing source according to the present invention, cesium carbonate and the tungsten filament are more positively brought into contact with each other, and thus, even if the concentration of cesium is low, a device with excellent characteristics can be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2005-360025, filed Dec. 14, 2005, and 2006-325113, filed Dec. 1, 2006, which are hereby incorporated by reference herein in their entirety.

What is claimed is:

1. A vapor deposition system comprising:
a container for containing a vapor deposition material therein, the container having an opening;
a heating unit for vaporizing the vapor deposition material contained in the container;
a medium provided in the container such that the vaporized vapor deposition material is in contact with the medium; and
a shielding member for shielding heat generated by the medium,
wherein the medium can be heated to 200° C. or higher and is composed of a metal, which decomposes the vapor deposition material by a chemical reaction,
wherein the shielding member is provided at the opening of the container and the medium is provided in a space defined by the shielding member and the container, and the shielding member has an opening; and wherein another shielding member having an opening is provided between the vapor deposition material and the medium, and the other shielding member is disposed so as to be spaced apart from the vapor deposition material.

2. The vapor deposition system according to claim 1, wherein the shape of the medium is a coiled filament.

* * * * *